United States Patent
Furuya et al.

(10) Patent No.: US 12,046,815 B2
(45) Date of Patent: Jul. 23, 2024

(54) FREQUENCY SELECTIVE SURFACE, AND ELECTROMAGNETIC WAVE ABSORBER

(71) Applicant: MITSUBISHI ELECTRIC CORPORATION, Tokyo (JP)

(72) Inventors: Koichi Furuya, Tokyo (JP); Tsuyoshi Kobayashi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 125 days.

(21) Appl. No.: 17/846,393

(22) Filed: Jun. 22, 2022

(65) Prior Publication Data

US 2022/0328973 A1   Oct. 13, 2022

Related U.S. Application Data (63) Continuation of application No. PCT/JP2020/008091, filed on Feb. 27, 2020.

(51) Int. Cl.
*H01Q 15/00* (2006.01)
*H01Q 17/00* (2006.01)

(52) U.S. Cl.
CPC ....... *H01Q 15/0013* (2013.01); *H01Q 17/001* (2013.01)

(58) Field of Classification Search
CPC .. H01Q 15/00; H01Q 15/0013; H01Q 15/002; H01Q 17/00; H01Q 17/001; H01Q 1/38; H01Q 15/14
See application file for complete search history.

(56) References Cited

U.S. PATENT DOCUMENTS

| | | | |
|---|---|---|---|
| 5,400,043 A * | 3/1995 | Arceneaux | H01Q 15/0013 343/872 |
| 6,624,536 B1 | 9/2003 | Sawada et al. | |
| 8,098,213 B2 * | 1/2012 | Kim | H01P 1/20381 343/909 |
| 9,559,426 B1 * | 1/2017 | Cross | H01Q 15/002 |
| 10,739,437 B2 * | 8/2020 | Toyao | G01S 7/03 |
| 10,938,118 B2 * | 3/2021 | Takikawa | H01Q 15/147 |
| 11,831,073 B2 * | 11/2023 | Koul | H01Q 15/246 |
| 2003/0142036 A1 | 7/2003 | Wilhelm et al. | |

FOREIGN PATENT DOCUMENTS

| | | |
|---|---|---|
| JP | 11-177276 A | 7/1999 |
| JP | 2000-049487 A | 2/2000 |
| JP | 2001-339191 A | 12/2001 |
| JP | 2004-193531 A | 7/2004 |
| JP | 2007-143044 A | 6/2007 |

(Continued)

OTHER PUBLICATIONS

International Search Report (PCT/ISA/210) issued in PCT/JP2020/008091, dated Jun. 30, 2020.

(Continued)

*Primary Examiner* — Tho G Phan
(74) *Attorney, Agent, or Firm* — BIRCH, STEWART, KOLASCH & BIRCH, LLP (57) ABSTRACT

An FSS unit element includes: multiple conductors extending outward from the central portion of the FSS unit element; and at least one circuit element connected to the multiple conductors at the central portion of the FSS unit element, and disposed with fewer than the number of the multiple conductors.

9 Claims, 10 Drawing Sheets

(56) References Cited

FOREIGN PATENT DOCUMENTS

JP        2009-038785 A      2/2009
JP        2013-232733 A      11/2013

OTHER PUBLICATIONS

Office Action issued in Japanese Patent Application No. 2020-557365, dated Dec. 1, 2020.
Written Opinion (PCT/ISA/237) issued in PCT/JP2020/008091, dated Jun. 30, 2020.
Yoo et al., "Polarization-Independent and Ultrawideband Metamaterial Absorber Using a Hexagonal Artificial Impedance Surface and a Resistor-Capacitor Layer", IEEE Transactions on Antennas and Propagation, vol. 62, No. 5, May 2014, pp. 2652-2658.

* cited by examiner

FREQUENCY SELECTIVE SURFACE, AND ELECTROMAGNETIC WAVE ABSORBER

CROSS REFERENCE TO RELATED APPLICATIONS

This application is a Continuation of PCT International Application No. PCT/JP2020/008091, filed on Feb. 27, 2020, which is hereby expressly incorporated by reference into the present application.

TECHNICAL FIELD

The present disclosure relates to a frequency selective surface and an electromagnetic wave absorber.

BACKGROUND ART

A frequency selective surface (referred to as an "FSS" hereinafter) selectively absorbs an electromagnetic wave in a specific frequency band. An FSS is used for, for example, a measure against leakage of communication information or a measure against electromagnetic interference between systems.

An FSS has one or more FSS unit elements. Each FSS unit element has one or more conductors. When an electromagnetic wave is incident upon the FSS, a current is induced in the conductor.

There is a case in which in order to increase the absorbed amount of an electromagnetic wave in each FSS unit element, a circuit element is incorporated into the conductor. Such an FSS unit element in which the circuit element is incorporated is disclosed in, for example, Patent Literature 1. In this Patent Literature 1, a resistance is disclosed as an example of the circuit element.

CITATION LIST

Patent Literature

Patent Literature 1: JP 2009-38785 A

SUMMARY OF INVENTION

Technical Problem

The FSS unit element disclosed in Patent Literature 1 has the resistance for each conductor. Therefore, in the FSS unit element disclosed in Patent Literature 1, resistances whose number is equal to the number of conductors are needed.

The present disclosure is made in order to solve the above-mentioned problem, and it is therefore an object of the present disclosure to provide a frequency selective surface in which at least one circuit element can be disposed with fewer than the number of conductors.

Solution to Problem

A frequency selective surface according to the present disclosure is the one in which frequency selective surface unit elements are arranged periodically, in which each of the frequency selective surface unit elements includes: multiple conductors each extending with a same length in one of two directions perpendicular to each other and outward from a central portion of the corresponding frequency selective surface unit element; and at least one circuit element connected to the multiple conductors at the central portion of the corresponding frequency selective surface unit element, and disposed with fewer than the number of the multiple conductors. The frequency selective surface includes: a first arrangement in which a plurality of the frequency selective surface unit elements are arranged periodically; a second arrangement in which a plurality of frequency selective surface unit elements which are reverse of the frequency selective surface unit elements in the first arrangement are arranged periodically; a third arrangement in which a plurality of frequency selective surface unit elements which are rotation of the frequency selective surface unit elements in the first arrangement are arranged periodically; and a fourth arrangement in which a plurality of frequency selective surface unit elements which are rotation of the frequency selective surface unit elements in the second arrangement are arranged periodically.

Advantageous Effects of Invention

According to the present disclosure, at least one circuit element can be disposed with fewer than the number of conductors.

DESCRIPTION OF EMBODIMENTS

Hereinafter, in order to explain the present disclosure in greater detail, embodiments of the present disclosure will be explained with reference to the accompanying drawings.

Embodiment 1

Figure 1:
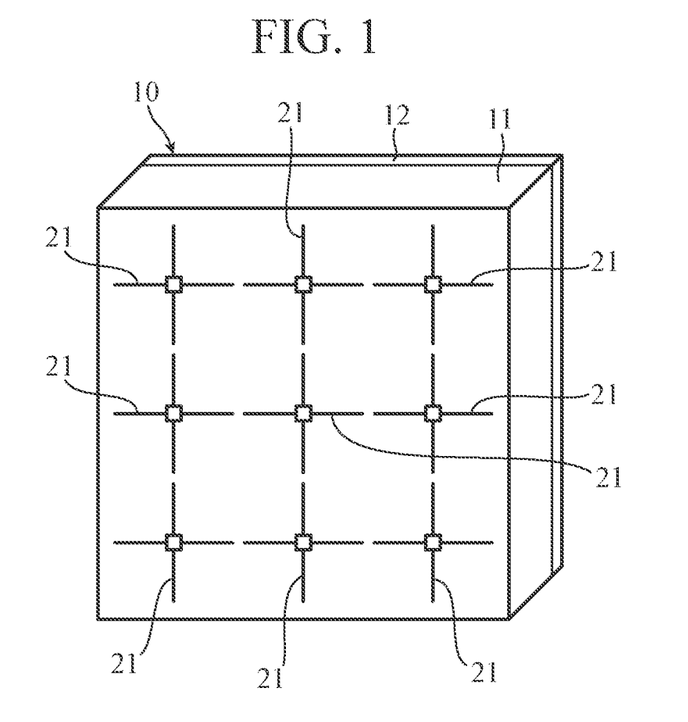
FIG. 1 is a front view showing a structure of an electromagnetic wave absorber including FSS unit elements according to Embodiment 1.
Figure 2:
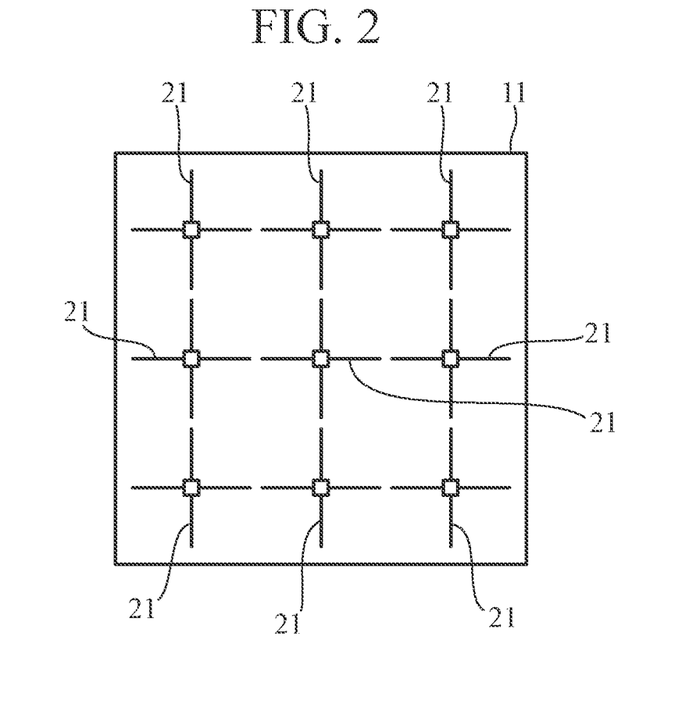
FIG. 2 is a front view showing a structure of an FSS including the FSS unit elements according to Embodiment 1.
Figure 3:
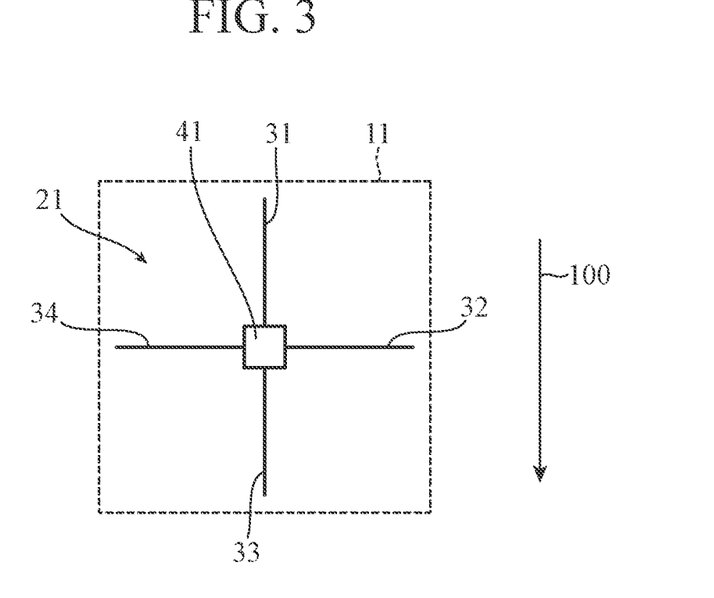
FIG. 3 is a front view showing a structure of an FSS unit element according to Embodiment 1.

An FSS unit element 21 according to Embodiment 1 will be explained using FIGS. 1 to 3. FIG. 1 is a front view showing a structure of an electromagnetic wave absorber 10 including FSS unit elements 21 according to Embodiment 1. FIG. 2 is a front view showing a structure of an FSS including the FSS unit elements 21 according to Embodiment 1. FIG. 3 is a front view showing a structure of an FSS unit element 21 according to Embodiment 1.

As shown in FIG. 1, the electromagnetic wave absorber 10 is a so-called electromagnetic wave band filter, and selectively absorbs an electromagnetic wave in a specific frequency band. This electromagnetic wave absorber 10 includes a board 11 and a conductor board 12. The board 11 is, for example, a dielectric substrate. A front surface of this board 11 constitutes the FSS. The conductor board 12 is disposed on a rear surface of the board 11.

As shown in FIG. 2, the FSS includes multiple FSS unit elements 21. In the FSS, these FSS unit elements 21 are arranged periodically in two dimensions.

As shown in FIG. 3, the FSS unit element 21 has multiple conductors 31 to 34 and a single circuit element 41, for example. More specifically, because the FSS unit element 21 has the four conductors 31 to 34, the FSS unit element is of quadrupole type.

In the conductors 31 to 34, a current is induced by an electric field 100 of an incident electromagnetic wave. Each of these conductors 31 to 34 is formed in linear shape, and extends outward from a central portion of the FSS unit element 21. One ends of the conductors 31 to 34 are arranged in the central portion of the FSS unit element 21, and the other ends of the conductors 31 to 34 are arranged in outward portions rather than in the central portion of the FSS unit element 21.

The circuit element 41 is disposed in the central portion of the FSS unit element 21, and is connected to each of the one ends of the conductors 31 to 34. The one ends of the conductors 31 to 34 are connected to respective four side faces of the circuit element 41. Although the conductors 31 to 34 are thus arranged as a whole in the shape of a cross, the arrangement is not limited to this example. More specifically, the number of circuit elements 41 is smaller than the number of conductors 31 to 34. At this time, it doesn't matter whether or not the one ends of the conductors 31 to 34 are connected to one another.

In FIG. 3, an arrow showing the electric field 100 shows the polarization direction of the electric field 100.

The circuit element 41 responds to a current flowing thereinto from the conductors 31 to 34. This circuit element 41, for example, achieves a specific function in an electric circuit, such as a resistor or an electric circuit having a frequency characteristic, by means of a circuit component such as a chip, or a conductor pattern.

Then, when an electromagnetic wave is incident upon the electromagnetic wave absorber 10, a current is induced in a conductor which is the most parallel to the polarization direction of the electric field 100, out of the conductors 31 to 34. When this current flows into the circuit element 41 from the conductors 31 to 34, the circuit element 41 makes a response which depends upon the type thereof and which will be explained below.

In the case where a resistive element is used for the circuit element 41, the current flowing through the circuit element 41 has a loss caused by the circuit element 31. Therefore, the energy of the incident electromagnetic wave is absorbed.

Therefore, because the FSS unit element 21 can achieve an absorption characteristic for the incident electromagnetic wave by using only a single resistive element, the number of resistive elements per unit element can be reduced, as compared with a conventional unit element structure of having a resistive element for each conductor. The resistive element is, for example, a resistor or a resistance film.

In the case where a capacitor element is used for the circuit element 41, a current flowing through the circuit element 41 has an effect of capacitance occurring in terms of circuit, the effect being caused by the circuit element 41. Therefore, the frequency characteristic of the FSS unit element 21 shifts toward low frequencies because of an increase in the equivalent capacitance value of the FSS unit element 21. More specifically, because the operating frequency of the FSS can be lowered while the size of the FSS unit element 21 is maintained, the FSS unit element 21 can be downsized.

Therefore, because the FSS makes it possible to perform an adjustment of the frequency characteristic for incident electromagnetic waves and to achieve a downsizing of the FSS unit element 21 by using only a single capacitor element, the number of capacitor elements per unit element can be reduced, as compared with a conventional unit element structure of having a capacitor element for each conductor. The capacitor element is a capacitor, or a capacitance circuit implemented by gaps formed among the one ends of the conductors 31 to 34.

In the case where an inductor element is used for the circuit element 41, a current flowing through the circuit element 41 has an effect of inductance occurring in terms of circuit, the effect being caused by the circuit element 41. Therefore, the frequency characteristic of the FSS unit element 21 shifts toward low frequencies because of an increase in the equivalent inductance value of the FSS unit element 21. More specifically, because the operating frequency of the FSS can be lowered while the size of the FSS unit element 21 is maintained, the FSS unit element 21 can be downsized.

Therefore, because the FSS makes it possible to perform an adjustment of the frequency characteristic for incident electromagnetic waves and to achieve a downsizing of the FSS unit element 21 by using only a single inductor element, the number of inductor elements per unit element can be reduced, as compared with a conventional unit element structure of having an inductor element for each conductor. The inductor element is, for example, an inductor, or an inductance circuit implemented by meandering or the like of conductors.

In the case where an active element is used for the circuit element 41, a conduction state for a current flowing through the circuit element 41 can be changed by, for example, an external bias circuit. Therefore, the FSS makes it possible to electrically change the characteristics of the FSS unit element 21.

Therefore, because the FSS can achieve a dynamic control function for incident electromagnetic waves by using only a single active element, the number of active elements per unit element can be reduced, as compared with a conventional unit element structure of having an active element for each conductor. The active element is, for example, a diode or the like.

Here, in the case where a passive element, such as a resistive element, a capacitor element or an inductor element, is used for the circuit element 41, the element value of the passive element is substantially equal to a value of two passive elements which are connected in series, a conventional unit element structure having, for each conductor, one of the two passive elements.

As mentioned above, the FSS unit element 21 according to Embodiment 1 includes multiple conductors 31 to 34 extending outward from the central portion of the FSS unit element, and the circuit element 41 connected to the multiple conductors 31 to 34 at the central portion of the FSS unit element, and arranged in such a way that the number of circuit elements is smaller than the number of multiple conductors 31 to 34. Therefore, in the FSS unit element 21, the circuit element 41 can be disposed with fewer than the number of multiple conductors 31 to 34.

By setting the number of circuit elements 41 in the FSS unit element 21 to one, the manufacturing cost can be reduced.

Embodiment 2

Figure 4:
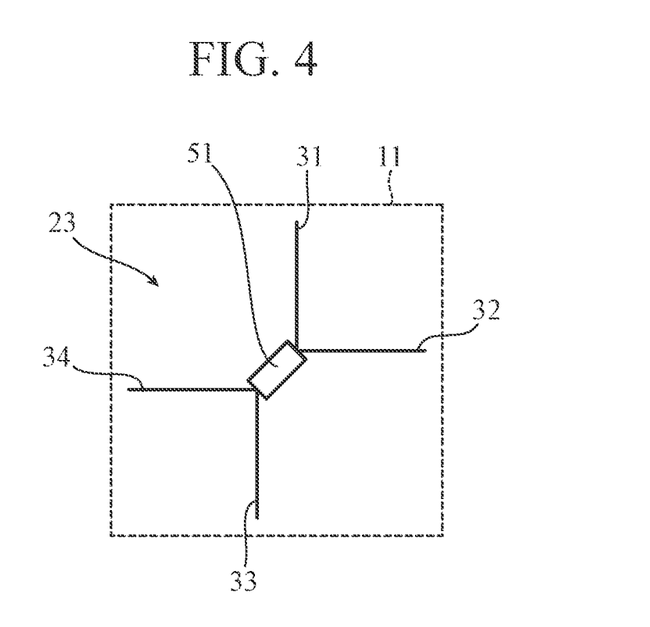
FIG. 4 is a front view showing a structure of an FSS unit element according to Embodiment 2.
Figure 5:
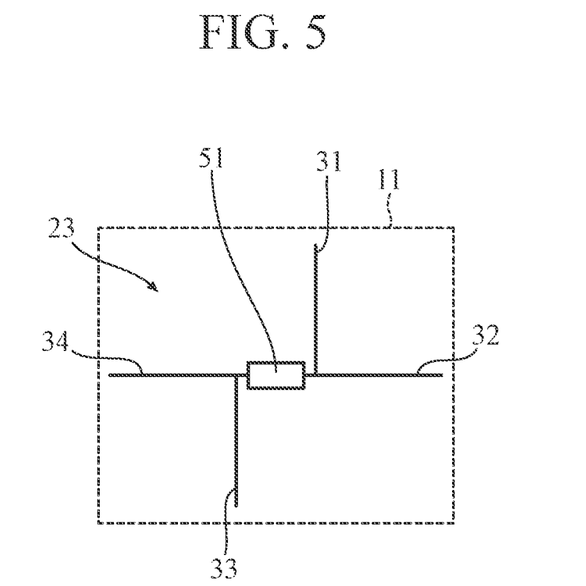
FIG. 5 is a front view showing another structure of the FSS unit element according to Embodiment 2.

An FSS unit element 23 according to Embodiment 2 will be explained using FIGS. 4 and 5. FIG. 4 is a front view showing a structure of the FSS unit element 23 according to Embodiment 2. FIG. 5 is a front view showing another structure of the FSS unit element 23 according to Embodiment 2.

As shown in FIG. 4, the FSS unit element 23 has, for example, multiple conductors 31 to 34 and a circuit element 51. One of a resistive element, a capacitor element, an inductor element and an active element is used for the circuit element 51 in the same way that one of them is used for the circuit element 41.

In the FSS unit element 23, the conductors 31 to 34 are divided into a set of the conductors 31 and 32 and a set of the conductors 33 and 34. In the conductors 31 and 32, a connection portion in which their one ends are connected to each other is connected to the circuit element 51. In the conductors 33 and 34, a connection portion in which their one ends are connected to each other is connected to the circuit element 51.

The circuit element 51 has two terminals. One of the terminals of the circuit element 51 is connected to the connection portion of the conductors 31 and 32. Further, the other terminal of the circuit element 51 is connected to the connection portion of the conductors 33 and 34.

In the FSS unit element 23, the connection portion of each of the two sets is connected to the circuit element 51, as mentioned above, and, as a result, the set of the conductors 31 and 32 and the set of the conductors 33 and 34 are arranged in such a way as to be point symmetric to each other with respect to the circuit element 51.

In contrast, in the FSS unit element 23 shown in FIG. 5, although the conductors 31 to 34 are divided into a set of conductors 31 and 32 and a set of conductors 33 and 34, each of the sets does not have a connection portion as previously mentioned in which one ends of the conductors of the corresponding set are connected to each other, but has an intersection portion in which the conductors of the corresponding set intersect each other.

Concretely, one end of the conductor 31 is connected to an in-between portion of the conductor 32 other than one end and the other end of the conductor 32. At this time, the one end of the conductor 32 is connected to one terminal of a circuit element 51. Further, one end of the conductor 33 is connected to an in-between portion of the conductor 34 other than one end and the other end of the conductor 34. At this time, the one end of the conductor 34 is connected to the other terminal of the circuit element 51.

In the alternative FSS unit element 23, the one ends of each of the sets are connected to the circuit element 51, as mentioned above, and, as a result, the set of the conductors 31 and 32 and the set of the conductors 33 and 34 are arranged in such a way as to be point symmetric to each other with respect to the circuit element 51.

As mentioned above, in the FSS unit element 23 according to Embodiment 2, the set of the conductors 31 and 32 having a connection portion in which their one ends are connected to each other and the set of the conductors 33 and 34 having a connection portion in which their one ends are connected to each other are provided, and the connection portion of each of the sets is connected to the circuit element 51. Alternatively, in the FSS unit element 23 according to Embodiment 2, the set of the conductors 31 and 32 which intersect each other and the set of the conductors 33 and 34 which intersect each other are provided, and the one ends of the conductors 32 and 34 of the sets are connected to the circuit element 51. Therefore, in the FSS unit element 23, the connection positions with the conductors 31 to 34 in the circuit element 51 can be reduced.

Embodiment 3

Figure 6:
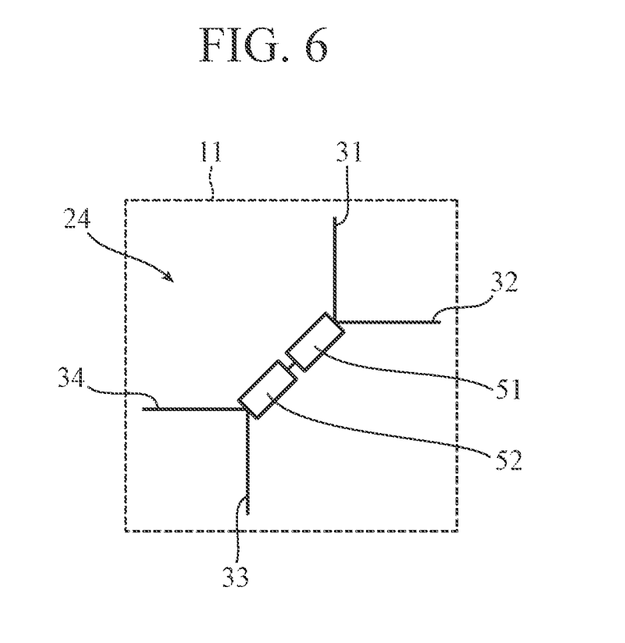
FIG. 6 is a front view showing a structure of an FSS unit element according to Embodiment 3.
Figure 7:
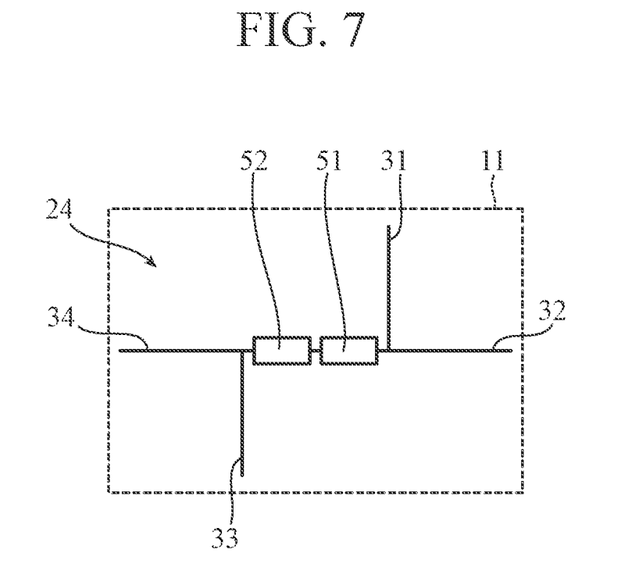
FIG. 7 is a front view showing another structure of the FSS unit element according to Embodiment 3.
Figure 8:
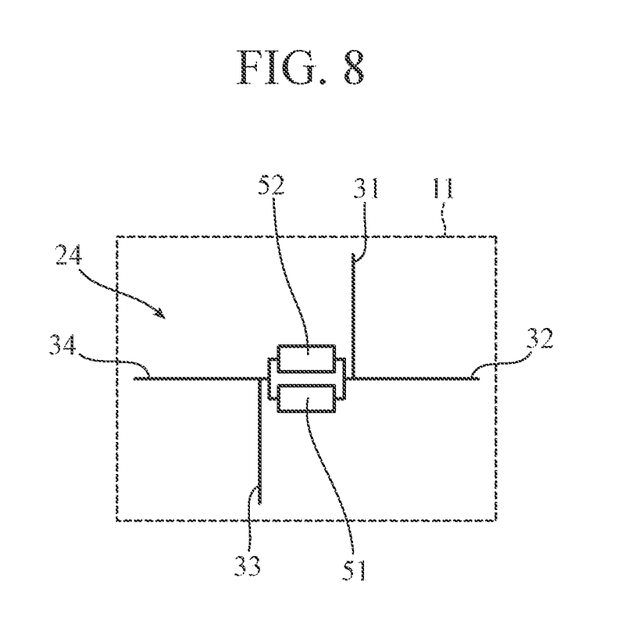
FIG. 8 is a front view showing another structure of the FSS unit element according to Embodiment 3.

An FSS unit element 24 according to Embodiment 3 will be explained using FIGS. 6 to 8. FIG. 6 is a front view showing a structure of the FSS unit element 24 according to Embodiment 3. FIG. 7 is a front view showing another structure of the FSS unit element 24 according to Embodiment 3. FIG. 8 is a front view showing another structure of the FSS unit element 24 according to Embodiment 3.

The FSS unit element 24 according to Embodiment 3 has a structure in which a circuit element 52 is added to the FSS unit element 23 according to Embodiment 2. One of a resistive element, a capacitor element, an inductor element and an active element is used for this circuit element 52 in the same way that one of them is used for each of the circuit elements 41 and 51. Further, the circuit element 52 has two terminals.

For example, the FSS unit element 24 shown in FIG. 6 has a structure in which the circuit element 52 is added to the FSS unit element 23 shown in FIG. 4. The circuit elements 51 and 52 are connected in series between a set of conductors 31 and 32 and a set of conductors 33 and 34.

One terminal of the circuit element 51 is connected to a connection portion of the conductors 31 and 32, and the other terminal of the circuit element 51 is connected to one terminal of the circuit element 52. Further, the other terminal of the circuit element 52 is connected to a connection portion of the conductors 33 and 34. Therefore, in the FSS unit element 24 shown in FIG. 6, the set of the conductors 31 and 32 and the set of the conductors 33 and 34 are arranged in such a way as to be point symmetric to each other with respect to the circuit elements 51 and 52.

In the FSS unit element 24 shown in FIG. 6, the circuit elements 51 and 52 may be connected in parallel between the connection portion of the conductors 31 and 32 and the connection portion of the conductors 33 and 34.

The FSS unit element 24 shown in FIG. 7 has a structure in which a circuit element 52 is added to the FSS unit element 23 shown in FIG. 5. The circuit elements 51 and 52 are connected in series between a set of conductors 31 and 32 and a set of conductors 33 and 34.

One terminal of the circuit element 51 is connected to one end of the conductor 32, and the other terminal of the circuit element 51 is connected to one terminal of the circuit element 52. Further, the other terminal of the circuit element 52 is connected to one end of the conductor 34. Therefore, in the FSS unit element 24 shown in FIG. 6, the set of the conductors 31 and 32 and the set of the conductors 33 and 34 are arranged in such a way as to be point symmetric to each other with respect to the circuit elements 51 and 52.

The FSS unit element 24 shown in FIG. 8 has a structure in which a circuit element 52 is added to the FSS unit element 23 shown in FIG. 5. The circuit elements 51 and 52 are connected in parallel between a set of conductors 31 and 32 and a set of conductors 33 and 34.

One terminal of the circuit element 51 and one terminal of the circuit element 52 are connected to one end of the conductor 32. Further, the other terminal of the circuit element 51 and the other terminal of the circuit element 52 are connected to one end of the conductor 34. Therefore, in the FSS unit element 24 shown in FIG. 8, the set of the conductors 31 and 32 and the set of the conductors 33 and 34 are arranged in such a way as to be point symmetric to each other with respect to the circuit elements 51 and 52.

As mentioned above, in the FSS unit element 24 according to Embodiment 3, the set of the conductors 31 and 32 having a connection portion in which their one ends are connected to each other and the set of the conductors 33 and 34 having a connection portion in which their one ends are connected to each other are provided, and the connection portion of each of the sets is connected to a corresponding one of the circuit elements 51 and 52. Alternatively, in the FSS unit element 24 according to Embodiment 3, the set of the conductors 31 and 32 which intersect each other and the set of the conductors 33 and 34 which intersect each other are provided, and the one ends of the conductors 32 and 34 of the sets are connected to the circuit elements 51 and 52, or alternatively, respectively connected thereto. Therefore, in the FSS unit element 23, the circuit elements 51 and 52 can be arranged with fewer than the number of multiple conductors 31 to 34.

Embodiment 4

Figure 9:
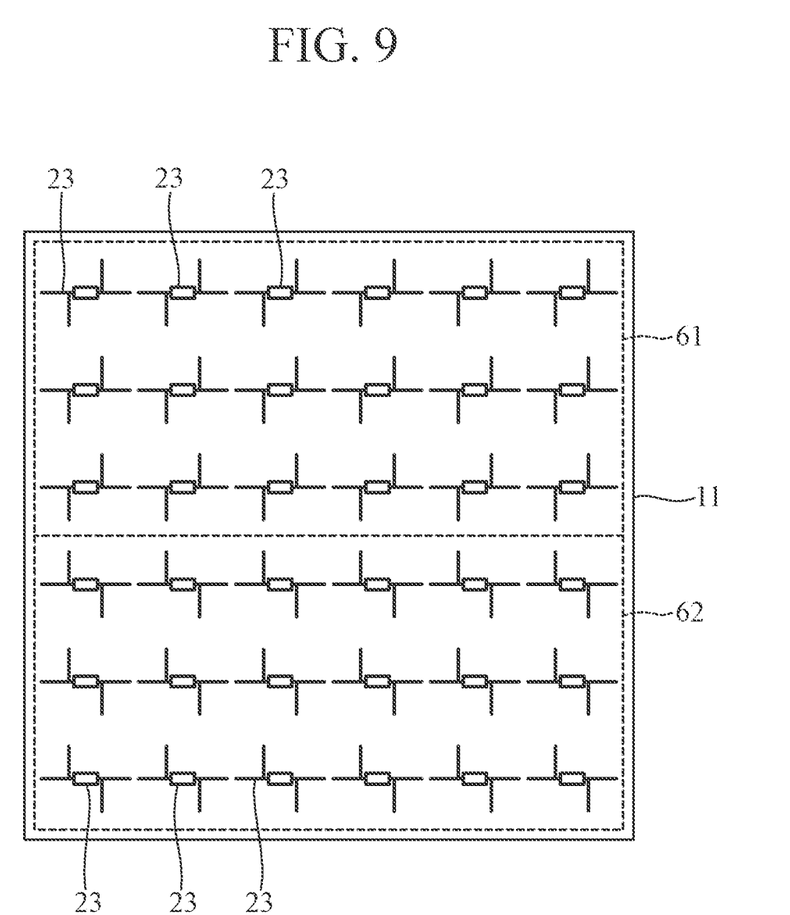
FIG. 9 is a front view showing a structure of an FSS according to Embodiment 4.
Figure 10:
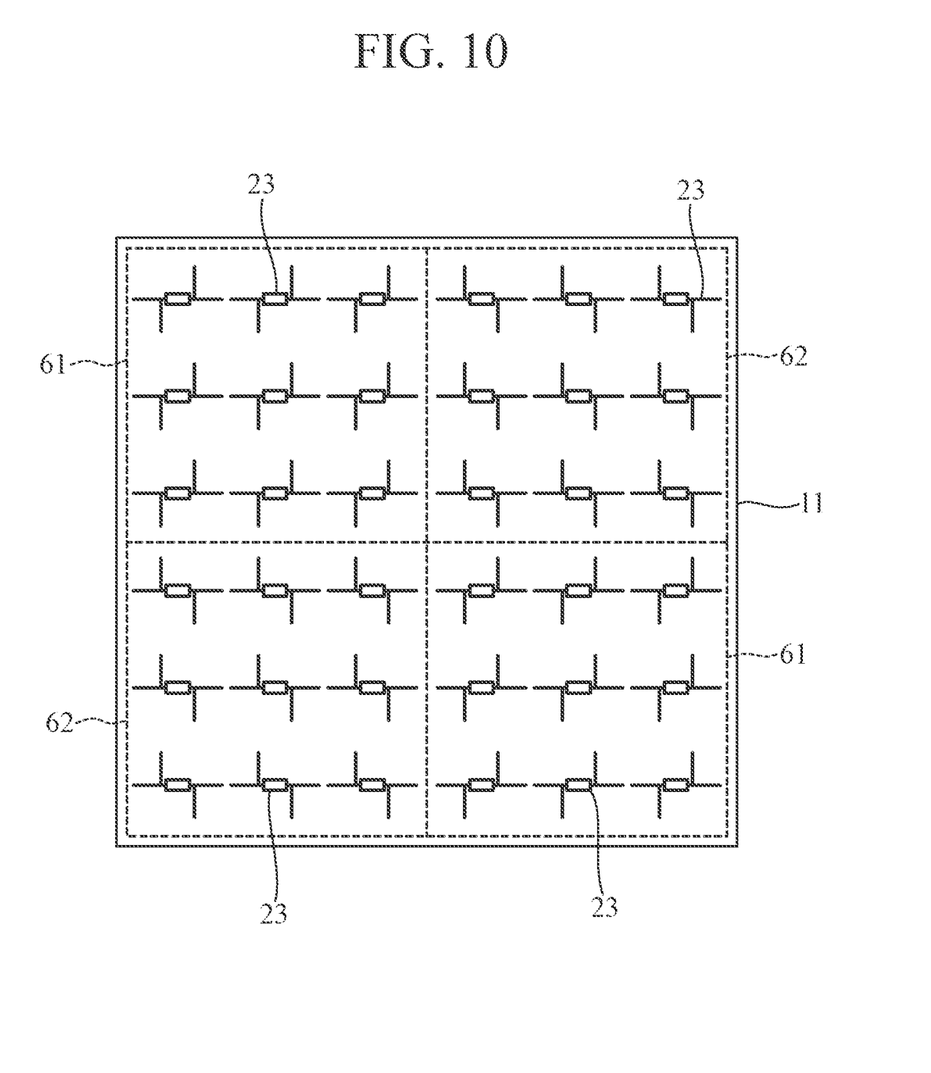
FIG. 10 is a front view showing another structure of the FSS according to Embodiment 4.

An FSS according to Embodiment 4 will be explained using FIGS. 9 and 10. FIG. 9 is a front view showing a structure of the FSS according to Embodiment 4. FIG. 10 is a front view showing another structure of the FSS according to Embodiment 4.

Here, in an FSS in which the FSS unit elements 23 or 24 according to above-mentioned Embodiment 2 or 3 are arranged periodically, the FSS unit elements 23 or 24 have the same orientation. In the case where such a structure is adopted, there is a problem that when a polarized wave is incident upon the FSS, a cross-polarized wave is generated along a direction substantially perpendicular to the incidence direction of this polarized wave, and this cross-polarized wave is reflected and transmitted.

Therefore, for the purpose of solving the above-mentioned problem, the FSS according to Embodiment 4 adopts a structure in which the orientations of the FSS unit elements 23 or 24 are made to partially differ, thereby suppressing the generation of cross-polarized waves. A case in which the FSS unit element 23 shown in FIG. 5, out of the FSS unit elements 23 and 24 according to Embodiments 2 and 3, is used in the FSS according to Embodiment 4 will be explained.

The FSS shown in FIG. 9 includes arrangements 61 and 62 in each of which the FSS unit elements 23 are arranged periodically. The orientation of the FSS unit elements 23 in the arrangement 61 is different from that of the FSS unit elements 23 in the arrangement 62.

For example, the arrangement 61 is the one in which multiple FSS unit elements 23 each shown in FIG. 5 are arranged periodically. The arrangement 62 is the one in which the multiple FSS unit elements each of which is a 180 degree reverse of each of the FSS unit elements 23 in the arrangement 61 with respect to the vertical center line of the FSS are arranged periodically. The arrangement 62 may be alternatively the one in which multiple FSS unit elements each of which is a 180 degree reverse of each of the FSS unit elements 23 in the arrangement 61 with respect to the horizontal center line of the FSS are arranged periodically. The arrangement 61 constitutes a first arrangement, and the arrangement 62 constitutes a second arrangement.

Therefore, when an electromagnetic wave is incident upon the FSS of an electromagnetic wave absorber 10, a current flows on each of the FSS unit elements 23 in the arrangement 61 and a current flows on each of the FSS unit elements 23 in the arrangement 62. Because of this, a cross-polarized wave is reflected and transmitted, and a reflected wave and a transmitted wave are generated.

At this time, the electric field of each of the reflected and transmitted waves can be divided into two perpendicular components: a main polarized component and a cross-polarized component. The direction of the electric field of the main polarized component is the same as the incidence direction of a polarized wave, and the direction of the electric field of the cross-polarized component is perpendicular to the incidence direction of the polarized wave.

As mentioned above, the orientation of the FSS unit elements 23 in the arrangement 61 is made to be reverse to the orientation of the FSS unit elements 23 in the arrangement 62. Therefore, the main polarized components of the reflected and transmitted waves generated in the arrangement 61 and the main polarized components of the reflected and transmitted waves generated in the arrangement 62 have the same phase and the same amplitude. Further, the cross-polarized components of the reflected and transmitted waves generated in the arrangement 61 and the cross-polarized components of the reflected and transmitted waves generated in the arrangement 62 have opposite phases and the same amplitude.

As a result, those cross-polarized components cancel each other out and thus are "0" at a distant place. More specifically, the generation of cross-polarized waves is suppressed.

The arrangements 61 and 62 may be the ones in which the orientations of their FSS unit elements 23 are reverse to each other with respect to the horizontal center line. Further, although each of the arrangements 61 and 62 forms a rectangular shape, each of the arrangements may form a semicircular shape. Instead, the arrangement 61 may form a circular shape while the arrangement 62 may form an annular shape concentrically located outside the outer circumference of the arrangement 61 forming the circular shape.

As another example, multiple arrangements 61 and multiple arrangements 62 are provided in the FSS shown in FIG. 10. In the example of FIG. 10, a case in which two sets of arrangements 61 and 62 having a reverse relation as described above are provided is shown. Although the two sets of arrangements 61 and 62 are provided in the example of FIG. 10, three or more sets of arrangements may be provided.

As mentioned above, the FSS according to Embodiment 4 includes the arrangement 61 in which the multiple FSS unit elements 23 are arranged periodically, and the arrangement 62 in which the multiple FSS unit elements 23 are arranged periodically with their orientation being different from that of the FSS unit elements 23 in the arrangement 61. Therefore, the FSS can suppress the generation of cross-polarized waves.

Embodiment 5

Figure 11:
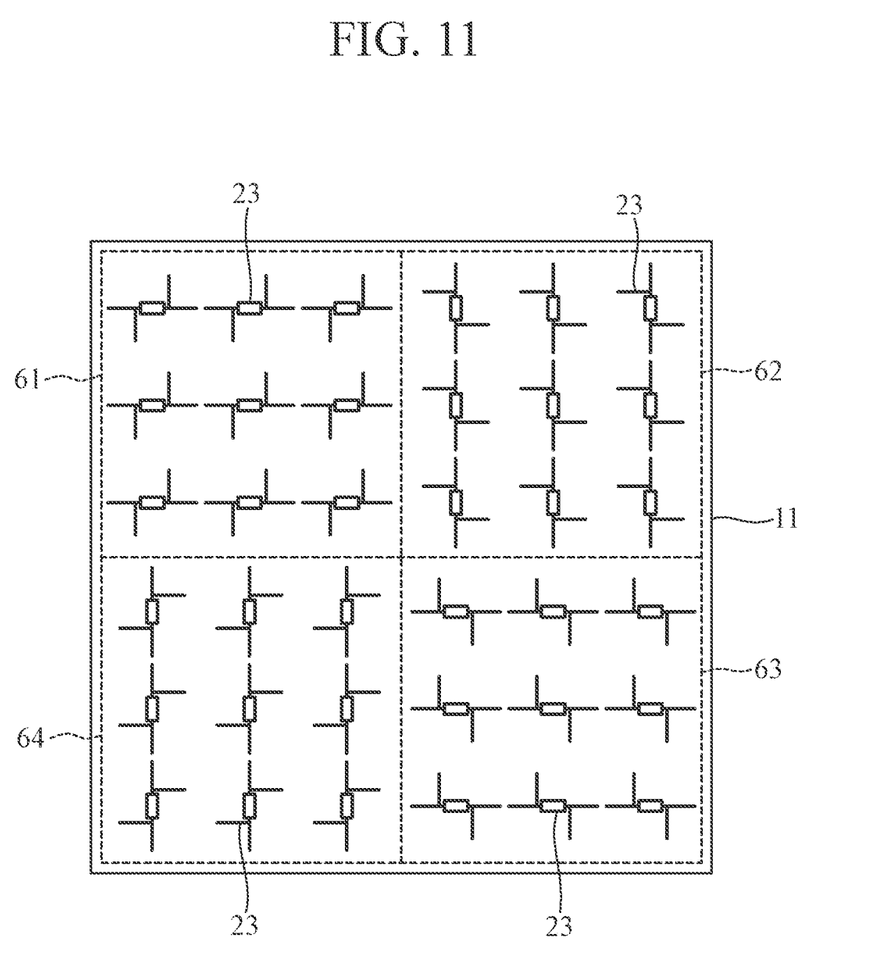
FIG. 11 is a front view showing a structure of an FSS according to Embodiment 5.

Embodiment 5 will be explained using FIGS. 11 to 14. FIG. 11 is a front view showing a structure of an FSS according to Embodiment 5.

The FSS according to Embodiment 5 achieves, without depending on a polarized wave incident thereupon, an advantageous effect equivalent to the suppression of cross-polarized waves which is provided by the FSS according to Embodiment 4.

The FSS shown in FIG. 11 includes arrangements 61 to 64 in each of which FSS unit elements 23 have the same orientation. The orientations of the FSS unit elements 23 arranged in the arrangements 61 to 64 differ from one another.

For example, the arrangement 61 is the one in which the multiple FSS unit elements 23 each shown in FIG. 5 are arranged periodically. The arrangement 62 is the one in which multiple FSS unit elements which are 90 degree counterclockwise-or-clockwise rotation of the FSS unit elements 23 in the arrangement 61 are arranged periodically. The arrangement 63 is the one in which multiple FSS unit elements which are 180 degree reverse of the FSS unit elements 23 in the arrangement 61 with respect to the vertical center line of the FSS are arranged periodically. The arrangement 64 in the one in which multiple FSS unit elements which are 90-degree counterclockwise-or-clockwise rotation of the FSS unit elements 23 in the arrangement 63 are arranged periodically. The arrangement 61 constitutes a first arrangement, and the arrangements 62 to 63 constitute second arrangements.

Therefore, because the FSS includes the arrangements 61 to 64 in which their respective orientations of the FSS unit elements 23 are different from one another, the FSS can suppress the generation of cross-polarized waves no matter how the incidence direction of the incident polarized wave is, and can achieve a reflection or transmission characteristic which does not depend on the incidence direction of the incident polarized wave.

Next, an electromagnetic wave absorber 10 including the FSS according to Embodiment 5 and an electromagnetic wave absorber 90 including a conventional FSS will be explained using FIGS. 12 to 14.

Figure 12A:
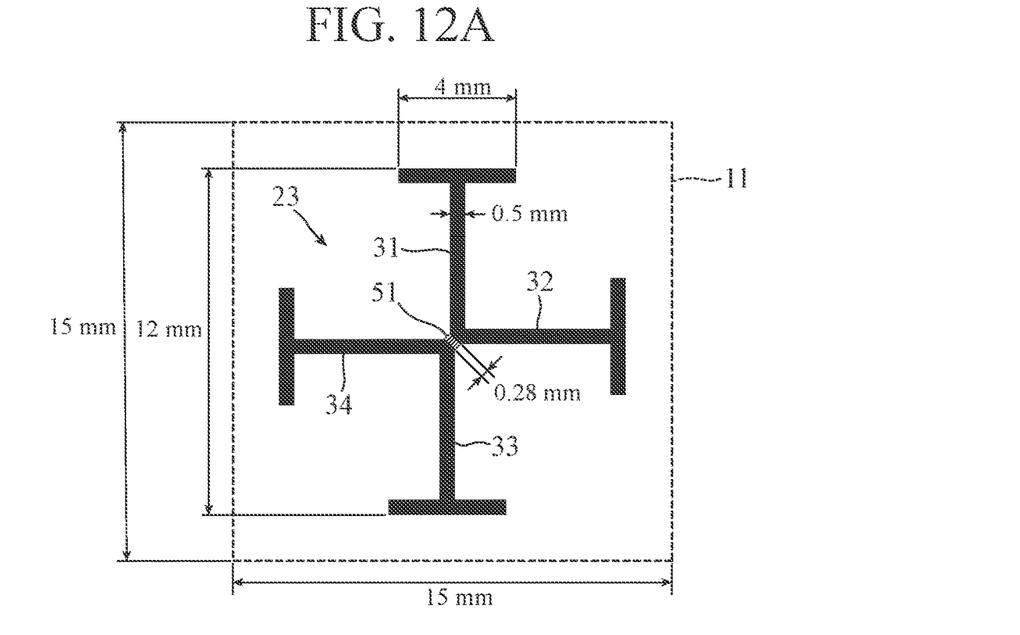
FIG. 12A is a front view showing a structure of an FSS unit element according to Embodiment 5.

FIG. 12A is a front view showing a structure of an FSS unit element 23 according to Embodiment 5. FIG. 12B is a front view showing a structure of the electromagnetic wave absorber 10 according to Embodiment 5. FIG. 13A is a front view showing a structure of a conventional FSS unit element 91. FIG. 13B is a front view showing a structure of the conventional electromagnetic wave absorber 90.

The FSS unit element 23 shown in FIG. 12A has the same structure as that of the FSS unit element 23 shown in FIG. 4. More specifically, in this FSS unit element 23, a set of conductors 31 and 32 and a set of conductors 33 and 34 are arranged in such a way as to be point symmetric to each other with respect to a single circuit element 51. As the circuit element 51, a resistive element is used.

Figure 12B:
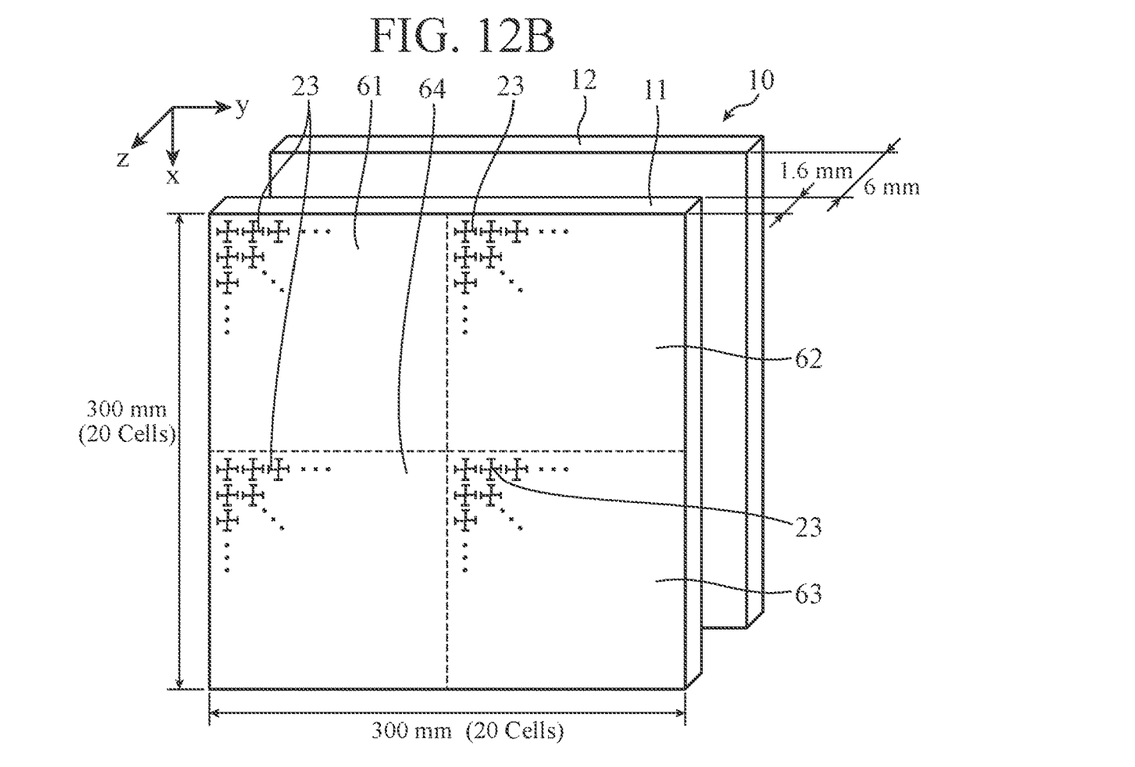
FIG. 12B is a front view showing a structure of an electromagnetic wave absorber according to Embodiment 5.

As shown in FIG. 12B, in each of the arrangements 61 to 64 which form the FSS, the multiple FSS unit elements 23 are arranged periodically. Because the periodic arrangements are the same as those shown in FIG. 11, an explanation of the periodic arrangements will be omitted. Further, the electromagnetic wave absorber 10 shown in FIG. 12B includes a board 11 having the front surface on which the above-mentioned FSS is formed, and a conductor board 12 placed on the opposite side of the front surface of the board 11.

In the example of FIGS. 12A and 12B, each FSS unit element 23 is placed in a square of 15 mm on a side in the FSS. This square forms one cell. The width of each of the conductors 31 to 34 is 0.5 mm. The length of the circuit element 51 is 0.28 mm. The element value of the circuit element 51 is 320Ω. The length including the circuit element 51 between the set of the conductors 31 and 32 and the set of the conductors 33 and 34, i.e., the length between the other ends of the conductors 31 and 33 and the length between the other ends of the conductors 32 and 34 are 12 mm. At each of the other ends of the conductors 31 to 34, a conductor piece which intersects perpendicularly with a direction of the length of the corresponding one of the conductors 31 to 34 is formed, and the length of this conductor piece is 4 mm.

The FSS of the electromagnetic wave absorber 10 is a square of 300 mm on a side. More specifically, this FSS includes 20 cells on a side. The thickness of the board 11 is 1.6 mm. The dielectric constant of the board 11 is 4.4. The conductor board 12 is placed at a distance of 6 mm from the rear surface of the board 11. Further, the vertical direction of the electromagnetic wave absorber 10 is defined as the x axis direction, and the downward direction is defined as the positive direction. The horizontal direction of the electromagnetic wave absorber 10 is defined as the y axis direction, and the rightward direction is defined as the positive direction. The front-back direction of the electromagnetic wave absorber 10 is defined as the z axis direction, and the forward direction is defined as the positive direction.

Figure 13A:
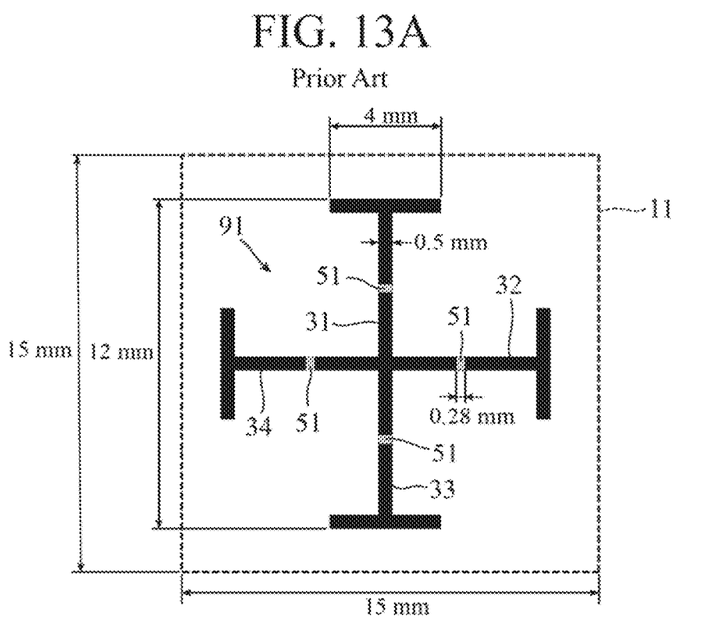
FIG. 13A is a front view showing a structure of a conventional FSS unit element.

In the conventional FSS unit element 91 shown in FIG. 13A, one ends of conductors 31 to 34 are connected directly to one another. Four circuit elements 51 which are resistive elements are provided for respective in-between portions of the conductors 31 to 34, in other words, for portions other than the one ends and the other ends of the conductors 31 to 34. In the conventional electromagnetic wave absorber 90 shown in FIG. 13B, multiple FSS unit elements 91 are arranged periodically in an FSS. More specifically, the conventional FFS does not include the arrangements 61 to 64.

Figure 13B:
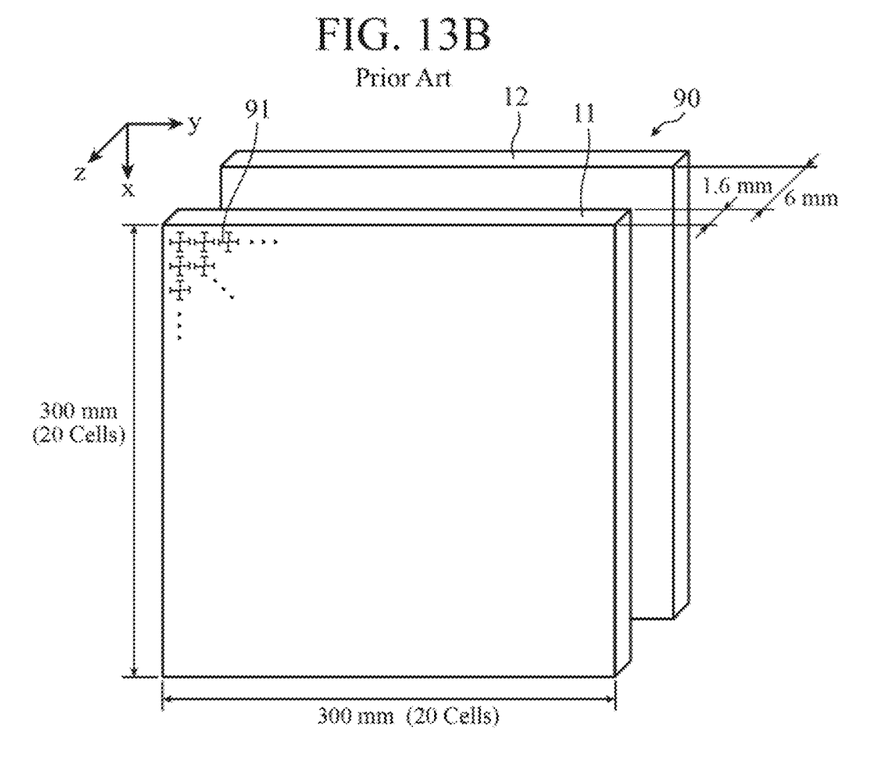
FIG. 13B is a front view showing a structure of a conventional electromagnetic wave absorber.

Because the size of each portion, the coordinate system, and so on in the example of FIGS. 13A and 13B are the same as those in the example of FIGS. 12A and 12B, an explanation will be omitted. Note that, the element value of the circuit element 51 used for the conventional FSS unit element 91 is 100Ω.

Figure 14:
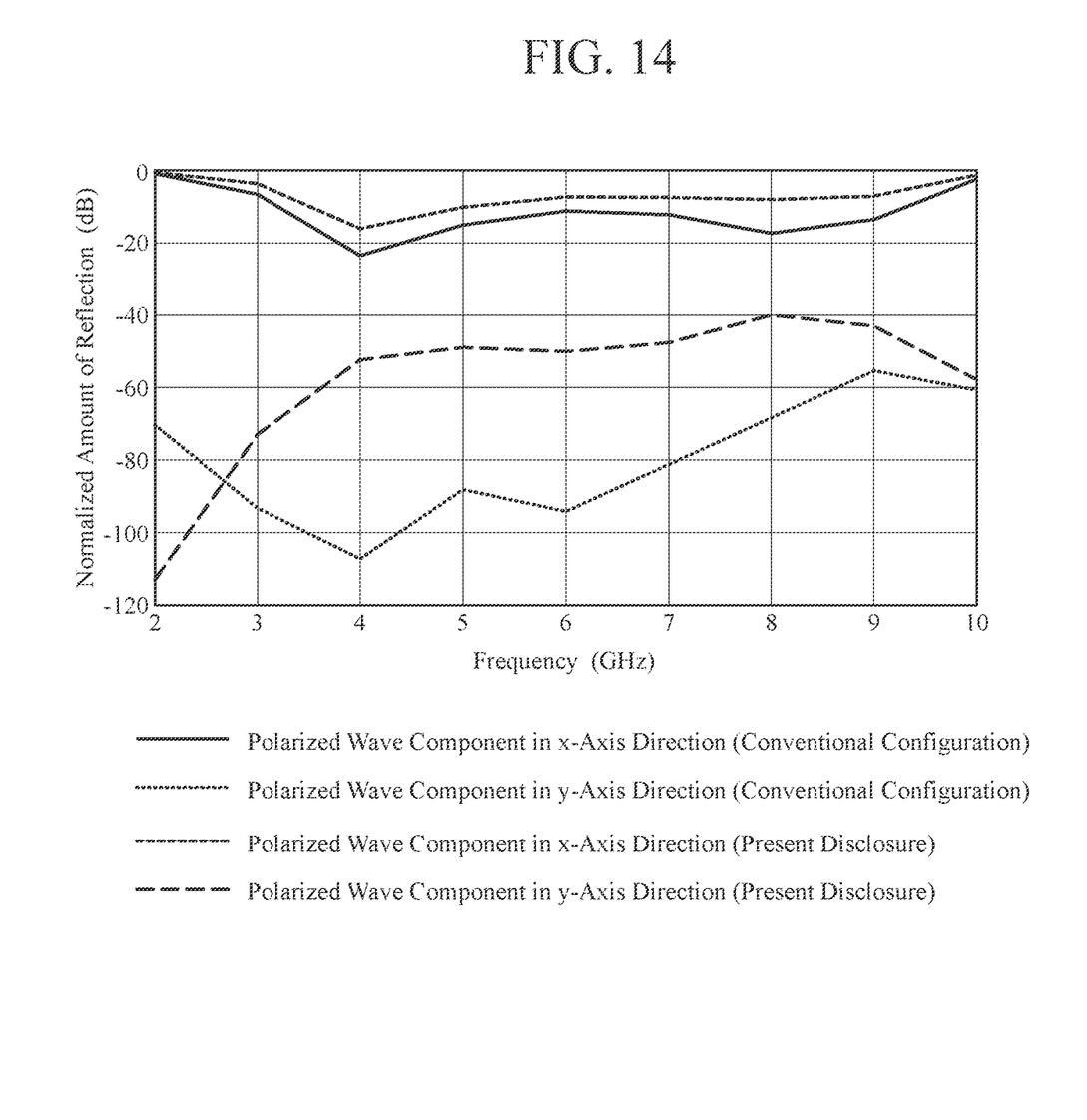
FIG. 14 is a diagram showing a relation between frequencies and normalized amounts of reflection.

FIG. 14 is a diagram showing a relation between frequencies (GHz) and normalized amounts of reflection (dB). Concretely, FIG. 14 is a diagram showing the normalized amount of reflection in the positive direction of the z axis when a wave polarized along the x-axis is incident upon the electromagnetic wave absorber 10 according to Embodiment 5 and the conventional electromagnetic wave absorber 90 from the positive direction of the z axis. Note that, the normalized amount of reflection is defined as both the reflection power of the main polarized component of a reflected wave caused by each of the electromagnetic wave absorbers 10 and 90, i.e., the reflection power of the polarized wave component along the x-axis of the reflected wave, and the reflection power of the cross-polarized component of the reflected wave, i.e., the reflection power of the polarized wave component along the y axis of the reflected wave when the reflection power of the main polarized component of a reflected wave caused by the conductor board 12 having the same area as the FSS, i.e., the reflection power of the polarized wave component along the x axis of the reflected wave is set as the reference. Four types of lines shown in FIG. 14 show the polarized wave components along the x- and y-axes of the reflected wave caused by the conventional electromagnetic wave absorber 90, and the polarized wave components along the x- and y-axes of the reflected wave caused by the electromagnetic wave absorber 10 according to Embodiment 5.

As shown in FIG. 14, the electromagnetic wave absorber 10 according to Embodiment 5 provides the wave absorption performance equivalent to the wave absorption performance (approximately 10 dB) achieved by the conventional electromagnetic wave absorber 90 for the polarized wave component along the x axis of the reflected wave, while reducing the number of circuit elements 51 to one quarter that in the conventional electromagnetic wave absorber 90. Further, it can be confirmed, from the fact that in the electromagnetic wave absorber 10 according to Embodiment 5, the value of the polarized wave component along the y axis of the reflected wave is very smaller than the value of the polarized wave component along the x axis of the reflected wave, that the electromagnetic wave absorber 10 is effective for the reduction in the polarized wave component along the y axis of the reflected wave. Further, because the electromagnetic wave absorber 10 has the structure in which the set of the conductors 31 and 32 and the set of the conductors 33 and 34 are arranged to be point symmetric to each other in such a way as to have the same shapes even though they are rotated counterclockwise or clockwise 90 degrees about the circuit element 51, it is also clear that the electromagnetic wave absorber 10 does not have a dependence on the polarized wave incident thereupon.

As mentioned above, the FSS according to Embodiment 5 includes the arrangement 61 in which the multiple FSS unit elements 23 are arranged periodically, and the arrangements 62 to 64 in each of which the multiple FSS unit elements 23 are arranged periodically with their orientation being different from that of the FSS unit elements 23 in the arrangement 61. Therefore, the FSS can suppress the generation of cross-polarized waves.

Further, the electromagnetic wave absorber 10 according to Embodiment 5 includes the FSS according to Embodiment 4 or 5, the board 11 on which the FSS is formed, and the conductor board 12 placed on the opposite side of the surface of the board 11 on which the FSS is formed. Therefore, the electromagnetic wave absorber 10 can suppress the generation of cross-polarized waves.

It is to be understood that any combination of two or more of the above-mentioned embodiments can be made, various changes can be made in any component in each of the above-mentioned embodiments, or any component in each of the above-mentioned embodiments can be omitted within the scope of the present disclosure.

INDUSTRIAL APPLICABILITY

Because the frequency selective surface according to the present disclosure includes at least one circuit element which is disposed at the central portion of the frequency selective surface unit element in such a way that the number of circuit elements is smaller than the number of multiple conductors, the circuit element can be disposed with fewer than the number of conductors, the frequency selective surface is suitable for use as a frequency selective surface and so on.

REFERENCE SIGNS LIST 10, 90 electromagnetic wave absorber, 11 board, 12 conductor board, 21, 23, 24, 91 FSS unit element, 31 to 34 conductor, 41, 51, 52 circuit element, 61 to 64 arrangement, and 100 electric field.

The invention claimed is:

1. A frequency selective surface in which frequency selective surface unit elements are arranged periodically, wherein
   each of the frequency selective surface unit elements includes:
   multiple conductors each extending with a same length in one of two directions perpendicular to each other and outward from a central portion of the corresponding frequency selective surface unit element; and
   at least one circuit element connected to the multiple conductors at the central portion of the corresponding frequency selective surface unit element, and disposed with fewer than the number of the multiple conductors, and wherein
   the frequency selective surface includes:
   a first arrangement in which a plurality of the frequency selective surface unit elements are arranged periodically;
   a second arrangement in which a plurality of frequency selective surface unit elements which are reverse of the frequency selective surface unit elements in the first arrangement are arranged periodically;
   a third arrangement in which a plurality of frequency selective surface unit elements which are rotation of the frequency selective surface unit elements in the first arrangement are arranged periodically; and
   a fourth arrangement in which a plurality of frequency selective surface unit elements which are rotation of the frequency selective surface unit elements in the second arrangement are arranged periodically.

2. The frequency selective surface according to claim 1, wherein multiple sets each including two of the multiple conductors having a connection portion in which one ends of the two of the multiple conductors are connected to each other are provided, and the connection portion of each of the sets is connected to the circuit element.

3. The frequency selective surface according to claim 1, wherein multiple sets each including two of the multiple conductors which intersect each other are provided, and one end of one of the two of the multiple conductors in each of the sets is connected to the circuit element.

4. The frequency selective surface according to claim 1, wherein the circuit element is a resistive element.

5. The frequency selective surface according to claim 1, wherein the circuit element is a capacitor element.

6. The frequency selective surface according to claim 1, wherein the circuit element is an inductor element.

7. The frequency selective surface according to claim 1, wherein the circuit element is an active element.

8. The frequency selective surface according to claim 1, wherein the circuit element is a passive element.

9. An electromagnetic wave absorber comprising:
   the frequency selective surface according to claim 1;
   a board on which the frequency selective surface is formed; and
   a conductor board disposed on an opposite side of a surface of the board on which the frequency selective surface is formed.

* * * * *